(12) United States Patent
Nakano et al.

(10) Patent No.: US 6,645,606 B2
(45) Date of Patent: Nov. 11, 2003

(54) ELECTRICAL DEVICE HAVING METAL PAD BONDED WITH METAL WIRING AND MANUFACTURING METHOD THEREOF

(75) Inventors: Tetsuo Nakano, Toyoake (JP); Yukihiro Maeda, Kasugai (JP); Yasutomi Asai, Okazaki (JP); Takashi Nagasaka, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/120,527

(22) Filed: Apr. 12, 2002

(65) Prior Publication Data

US 2002/0187319 A1 Dec. 12, 2002

(30) Foreign Application Priority Data

Jun. 6, 2001 (JP) .......................... 2001-171497
Jan. 18, 2002 (JP) .......................... 2002-009817

(51) Int. Cl.⁷ ..................... B32B 15/00; H01L 23/48
(52) U.S. Cl. ................... 428/209; 428/615; 428/618; 257/781; 257/784
(58) Field of Search ................... 174/259; 428/615, 428/209, 618; 257/781, 784

(56) References Cited

U.S. PATENT DOCUMENTS

| | | | | |
|---|---|---|---|---|
| 4,517,252 A | * | 5/1985 | Hugh | 428/553 |
| 4,840,302 A | * | 6/1989 | Gardner et al. | 228/123 |
| 5,647,942 A | | 7/1997 | Haji | |
| 5,829,124 A | * | 11/1998 | Kresge et al. | 29/840 |
| 5,897,336 A | * | 4/1999 | Brouillette et al. | 438/108 |
| 6,020,048 A | * | 2/2000 | Oka et al. | 428/209 |
| 6,335,104 B1 | * | 1/2002 | Sambucetti et al. | 428/615 |
| 6,435,398 B2 | * | 8/2002 | Hartfield et al. | 228/103 |

FOREIGN PATENT DOCUMENTS

| | | |
|---|---|---|
| JP | A-63-73697 | 4/1988 |
| JP | A-2-260550 | 10/1990 |
| JP | A-8-340019 | 12/1996 |
| JP | A-10-294394 | 11/1998 |
| JP | A-11-64139 | 3/1999 |
| JP | A-2000-58745 | 2/2000 |
| JP | A-2000-208548 | 7/2000 |

* cited by examiner

Primary Examiner—Cathy Lam
(74) Attorney, Agent, or Firm—Posz & Bethards, PLC

(57) ABSTRACT

A substrate has a first surface and a second surface. A plurality of pads is formed on the first surfaces. Each pads has a Cu plating layer and an Au plating layer that is directly formed on the Cu plating layer. Al wiring or Au wiring is bonded with the pads. The thickness of the Au plating layer that is bonded with the Al wiring is less than 0.5 $\mu$m. Thickness of the Au plating layer that is bonded with the Au wiring is 0.05 $\mu$m or more.

8 Claims, 9 Drawing Sheets

ELECTRICAL DEVICE HAVING METAL PAD BONDED WITH METAL WIRING AND MANUFACTURING METHOD THEREOF

CROSS REFERENCE TO RELATED APPLICATION

This application is based upon and claims the benefit of Japanese Patent Application No. 2001-171497 filed on Jun. 6, 2001 and No. 2002-9817 filed on Jan. 18, 2002, the contents of which are incorporated herein by reference.

FIELD OF THE INVENTION

The present invention relates to an electrical device having bonding pads that is bonded with metal wiring and a manufacturing method thereof.

BACKGROUND OF THE INVENTION

An electrical device such as the device shown in FIGS. 11A, 11B includes a substrate 10, which is made of ceramics or the like. Pads 22 for connecting to electrical parts or for bonding with wiring are formed on a first surface 11 and a second surface 12. The pads 22 include W (tungsten) layers 22a as base layers and Cu (cupper) plating layers 22b thereon. Regarding the pads 22 on the second surface 12, resistors 72 constructed by thick layers are formed through Cu thick layers 70. Further, a passivating glass 74 and a passivating resin 76 are respectively formed to cover the resistors 72, the Cu thick layers 70 and the pads 22.

Next, as shown in FIG. 11B, IC tips 30, 55 and other electrical parts 40 such as capacitors or the like are connected to the pads 22 formed on the first surface 11 by using solder 41, 51 and a conductive adhesive 31. Thereafter, the pads 22 are electrically connected to the IC tips 30, 55 via Au wiring 60 or Al wiring 61.

However, in the above-mentioned method, the heat used to melt the solder 41, 51 or for hardening the conductive adhesive 31 oxidizes the exposed Cu plating layers 22b of the pads 22 that are formed on the first surface 11. Therefore, a bonding force between the wiring 60, 61 and the Cu plating layers 22b decreases.

Alternatively, JP-A-2000-58745 discloses that Ni plating layer and Au plating layer are deposited on Cu conductive wiring in this order on a resin board. In this construction, oxidization of the Cu conductive wiring can be prevented. Further, Cu diffusion from the Cu conductive wiring to the Au plating layer decreases.

However, though the Cu in the Cu conductive wiring is a flexible material, it is possible that ultrasonic waves can be more easily transmitted during wire bonding because Ni is solid material. In addition, in the above-mentioned Cu—Ni—Au construction, a battery effect occurs between the Ni plating layer and the Au plating layer due to water in a humid environment. Therefore, corrosion by products such as NiOH or the like are generated, thereby possibly separating the bonding wiring from the pad.

SUMMARY OF THE INVENTION

It is therefore an object of the present invention to provide an electrical device having a metal pad bonded with metal wiring that is capable of obviating the above problem.

It is another object of the present invention to provide a metal pad that is capable of repressing separation of the metal wiring.

If a two-layer plating structure having a Cu plating layer and Au plating layer directly thereon is used as a pad, it is able to prevent the Cu plating layer from oxidizing because of the Au plating layer. Further, corrosion by products that would be generated between the Ni plating layer and the Au plating layer are not generated because the Ni plating layer is not used.

Accordingly, in this invention, a substrate has a first surface and a second surface. A plurality of pads is formed on the first surface. Further, each pad has a Cu plating layer and an Au plating layer that is directly formed on the Cu plating layer.

However, when the Al wiring is used as metal wiring, a Kirkendall void is generated between the Au plating and the Al wiring under a high temperature environment, thereby also separating the bonding wiring from the pad.

It is considered that the Kirkendall void is generated because a diffusion speed of Au under high temperature is much faster than that of the other metal materials, for example, Al, Cu. Namely, Au deficient portions are generated in the Au plating layer, thereby forming the Kirkendall void. Incidentally, regarding the three-layer construction having the Cu conductive wiring, the Ni plating layer and Au plating layer, the Kirkendall void is hard to generate because Au cannot diffuse due to a barrier layer of Ni plating.

Accordingly, in this present invention, the thickness of the Au plating layer that is bonded with the Al wiring is less than 0.5 $\mu$m.

Further, in case that the Al wiring is used as metal wiring, it possible that the wiring bonding separates from the pad if the Au plating layer is too thin.

Accordingly, the thickness of the Au plating layer that is bonded with the Au wiring is 0.05 $\mu$m or more.

BRIEF DESCRIPTION OF THE DRAWINGS

Other objects, features and advantages of the present invention will be understood more fully from the following detailed description made with reference to the accompanying drawings. In the drawings.

DETAILED DESCRIPTION OF THE PREFERRED EMBODIMENT

Figure 1A:
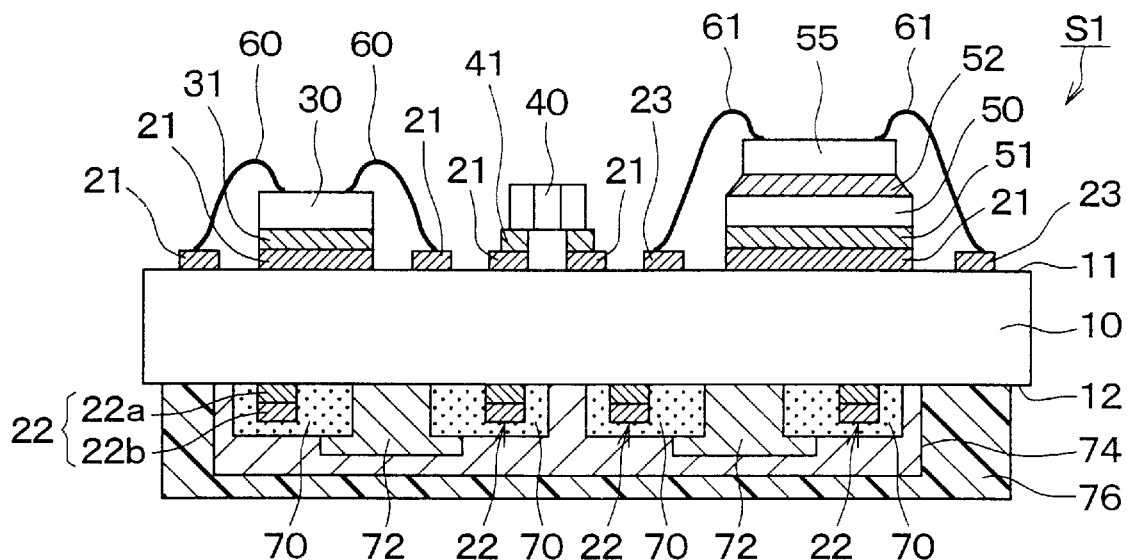
FIG. 1A is across sectional view showing an electrical device according to a first embodiment of the present invention.

The present invention will be described further with reference to various embodiments shown in the drawings.
(First Embodiment)

Referring to FIGS. 1A–11C, an electrical device S1 has a substrate 10 that is made of a ceramic material such as Alumina or the like. A plurality of pads 21, 22 and 23 for connecting to electrical parts or for wiring bonding are formed on a first surface 11 and a second surface 12. Respective pads 21–23 are electrically connected to a different wiring layer (not shown) on the substrate 10 and made of W (tungsten), Mo (molybdenum) or W—Mo alloy.

Figure 1B:
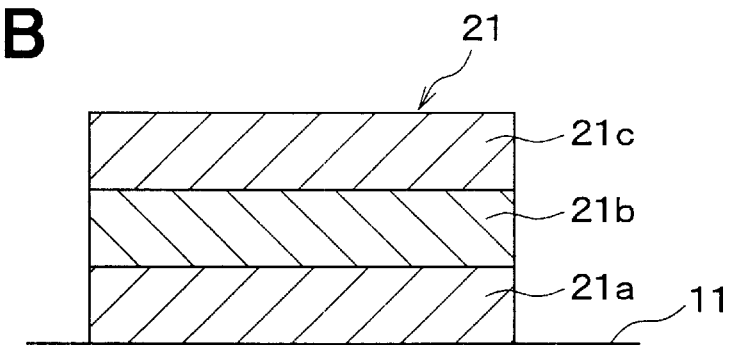
FIGS. 1B, 1C are enlarged views showing pads shown in FIG. 1A.
Figure 1C:
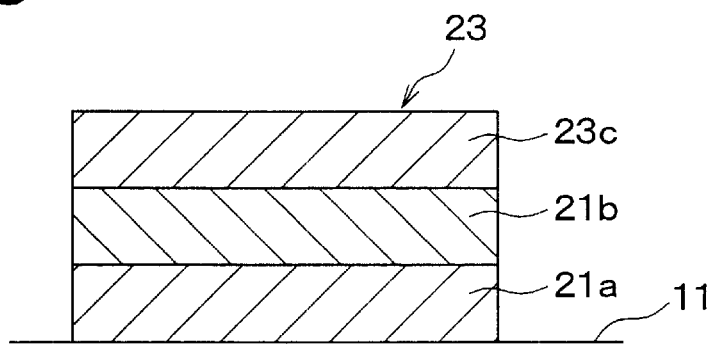

As shown in FIGS. 1B, 1C, the pads 21, 23 disposed on the first side (hereinafter referred to first side pads) form three-layer construction. The three-layer construction includes W layers 21a and Cu plating layers 21b as base layer sand Au plating layers 21c, 23c thereon.

The thickness of each Au plating layer 21c (FIG. 1B) is 0.05 $\mu$m or more. The thickness of the each Au planting layer 23c (FIG. 1C) is less than 0.5 $\mu$m.

Further, as shown in FIG. 1A, a first IC tip 30 is electrically connected to or mounted on the first side pad 21 by a conductive adhesive 31 that is formed by, for example, Ag (Silver) paste. A capacitor 40 is also electrically connected to and mounted on the first side pads 21 by a solder 41. A heat sink 50, which is connected with a second IC tip 55 by a high temperature melting solder 52, is electrically connected to or mounted the first pad 21 by an eutectic solder 51. The respective remainders of the first sidepads 21 not mounted to parts 30, 40, 50, are electrically connected to the first IC tip 30 by Au wiring 60. The first side pads 23 are electrically connected to the second IC tip 55 by Al wiring 61. Namely, in the electrical device S1, the pads 21 that connect with the Au wiring 60 and the pads 23 that connect with the Al wiring 61 are formed on the first side pads 21, 23.

A plurality of pads 22 disposed on the second side 12 (hereinafter referred to second side pads) form a two-layer construction including W layers 22a as base layers and Cu plating layers 22b thereon.

As shown in FIG. 1A, resistors 72 constructed by thick layers are connected to the second side pads 22 through Cu thick layers 70. The resistors 72 are made of a compound having mainly a conductive element, e.g., LaB$_6$ or SnO$_2$, and little glass. Specifically, the compound is printed and hardened through heating to form the resistors 72. Further, a passivating glass 74 and a passivating resin (e.g., UV resin) 76 are formed in this order so as to cover the resistors 72, the Cu thick layers 70 and the pads 22.

Referring to FIGS. 2A–4C, a process for forming the electrical device S1 will be described.

Figure 2A:
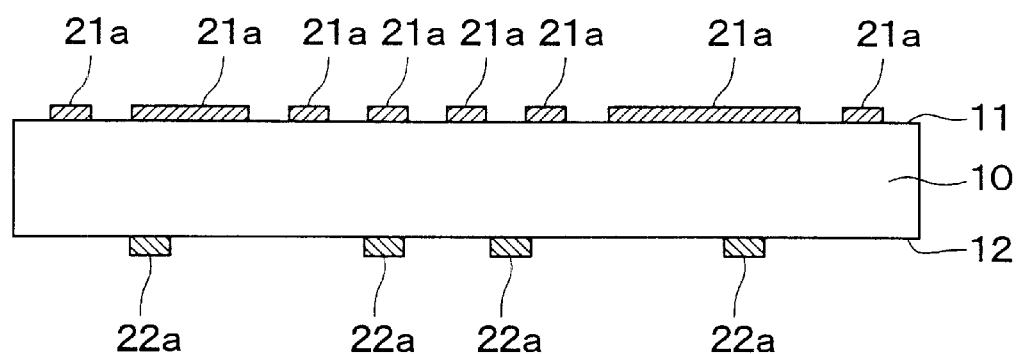
FIGS. 2A, 2B are cross sectional views showing production processes of the electrical device shown in FIG. 1A.
Figure 2B:
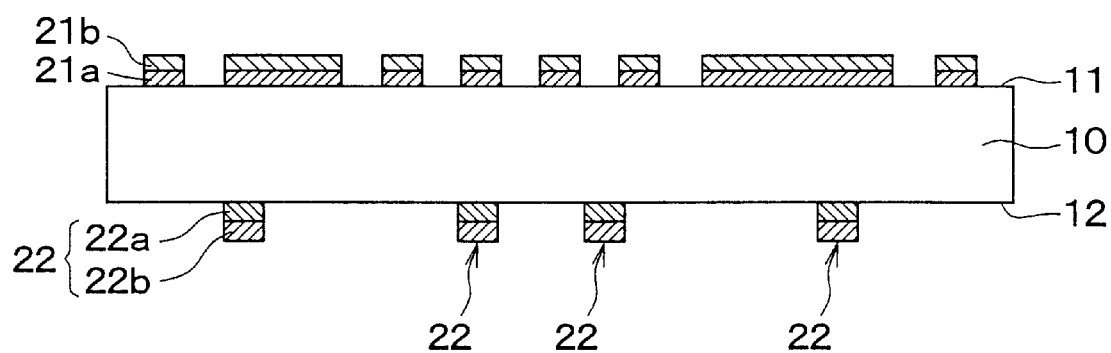

First, as shown in FIG. 2A, the substrate 10 having W layers 21a, 22a is prepared. The W layers 21a, 22a are already etched using a predetermined mask and wiring pattern. Next, as shown in FIG. 2B, Cu is plated on the surface of the respective W layers 21a, 22a, thereby forming the Cu plating layers 21b, 22b. In this way, the second side pads 22 are formed.

Figure 3A:
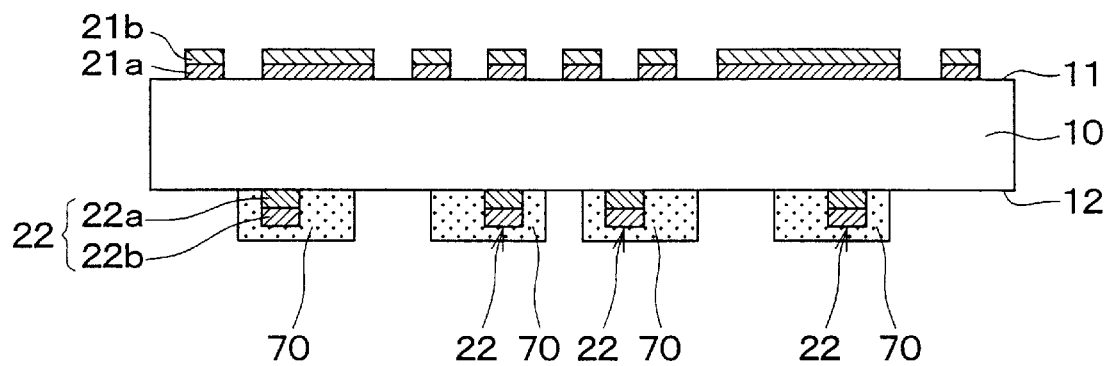
FIGS. 3A–3C are cross sectional views showing production processes of the electrical device following FIG. 2B.
Figure 3B:
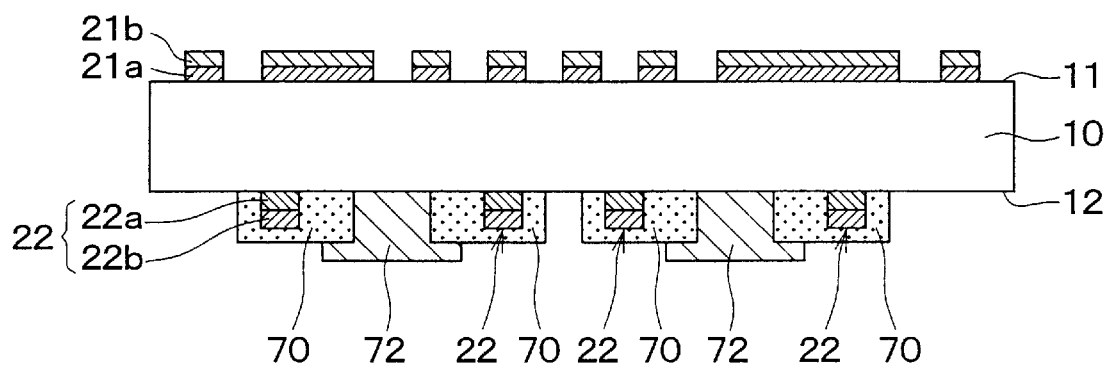
Figure 3C:
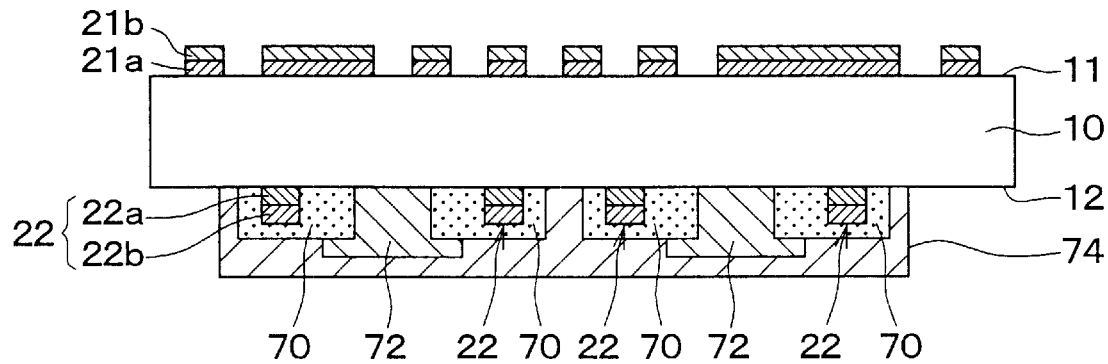

Further, as shown in FIG. 3A, the compound is printed on the Cu plating layers 21 and is heat-hardened, thereby forming the Cu thick layers 70. The resistors 72 are printed on the Cu thick layers 70 and are heat-hardened as shown in FIG. 3B. The passivating glass 74 is printed to cover the resistors 72, the Cu thick layers 70 and the pads 22 and is heat-hardened as shown in FIG. 3C.

Figure 4A:
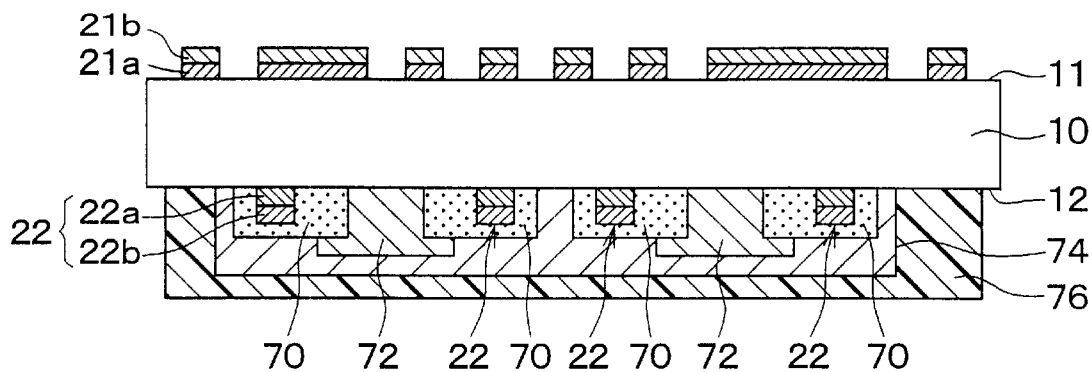
FIGS. 4A–4C are cross sectional views showing production processes of the electrical device following FIG. 3C.
Figure 4B:
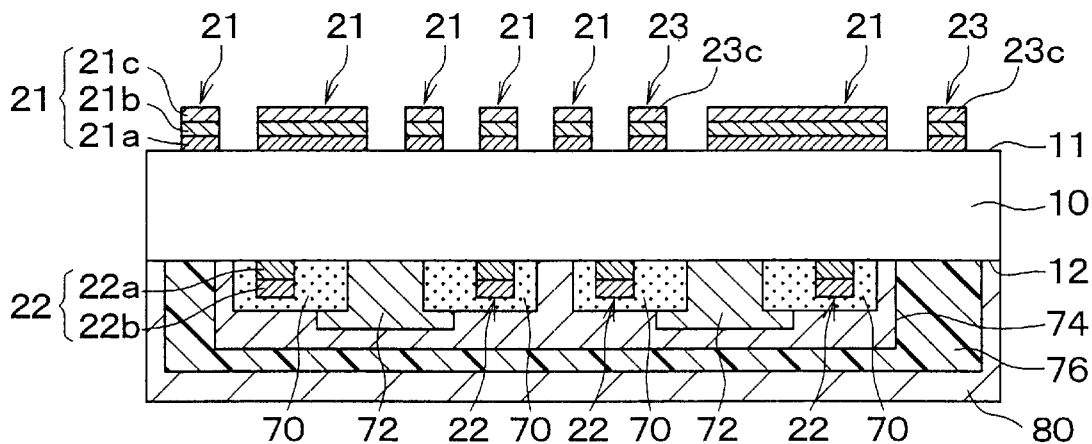

Next, as shown in FIG. 4A, the passivating resin 76 is formed to cover the passivating glass 74 by printing, irradiating with ultraviolet rays and the like. Subsequently, Au is plated on the Cu plating layers 21b by electroless plating with the passivating resin 76 is covered by a mask tape 80, thereby forming the Au planting layers 21c and 23c. Here, the Au plating condition is adjusted so that the Au plating layer 23c is less than 0.5 $\mu$m (e.g., 0.3 $\mu$m) and the Au planting layer 21c is 0.05 $\mu$m or more. Therefore, the first side pads 21, 23 are formed.

Figure 4C:
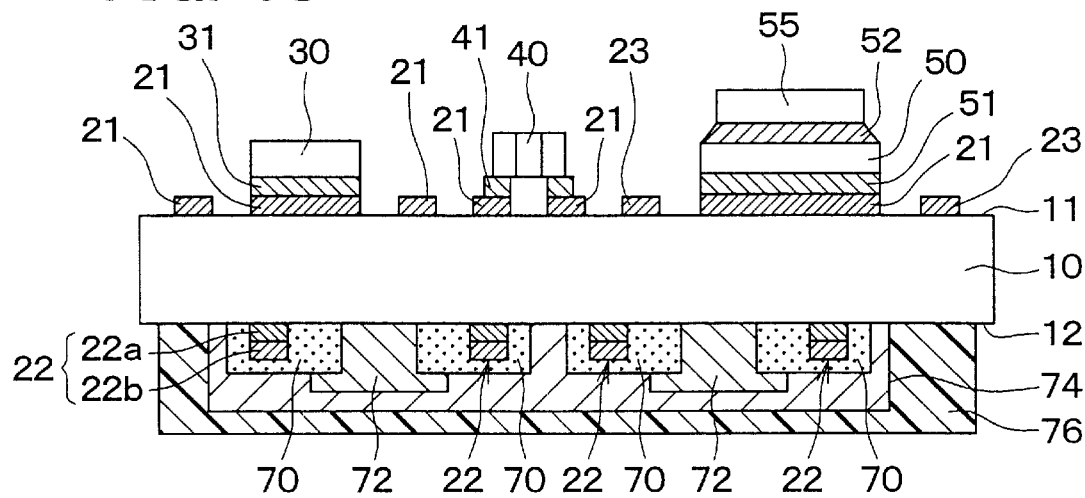

After the mask tape 80 is removed, as shown in FIG. 4C, the first IC tip 30 is electrically connected to or mounted on the first side pad 21. The capacitor 40 is electrically connected to the first side pad 21 by the solder 41. The heatsink 50, on which the second IC tip 55 is fixed, is electrically connected to or mounted on the first side pad 23 by the eutectic solder 51. The Au wiring 60 and the Al wiring 61 are then bonded between the electrical parts 30, 40 and 50 and the first side pads 21, 23. In this way, the electrical device S1 shown in FIG. 1A is completed.

According to this embodiment, the first side pads 21, 23 have the Au plating layers 21c, 23c that cover the surface of the Cu plating layers 21b. The Au plating layers 21c, 23c are low oxidization layers. Therefore, the Au plating layers 21c prevent the surface of the Cu plating layers 21b from oxidizing due to heat used to melt the solders 41,51, to harden the conductive adhesive 31 or the like.

Further, the first side pads 23 for bonding with Al wiring 61 have the Au plating layers 23c whose thickness is less than 0.5 $\mu$m. Therefore, the Kirkendall void that might be generated in joints between the first side pads 23 and the Al wiring 61 is suppressed, thereby enhancing the electrical and physical connection therebetween.

Figure 5:
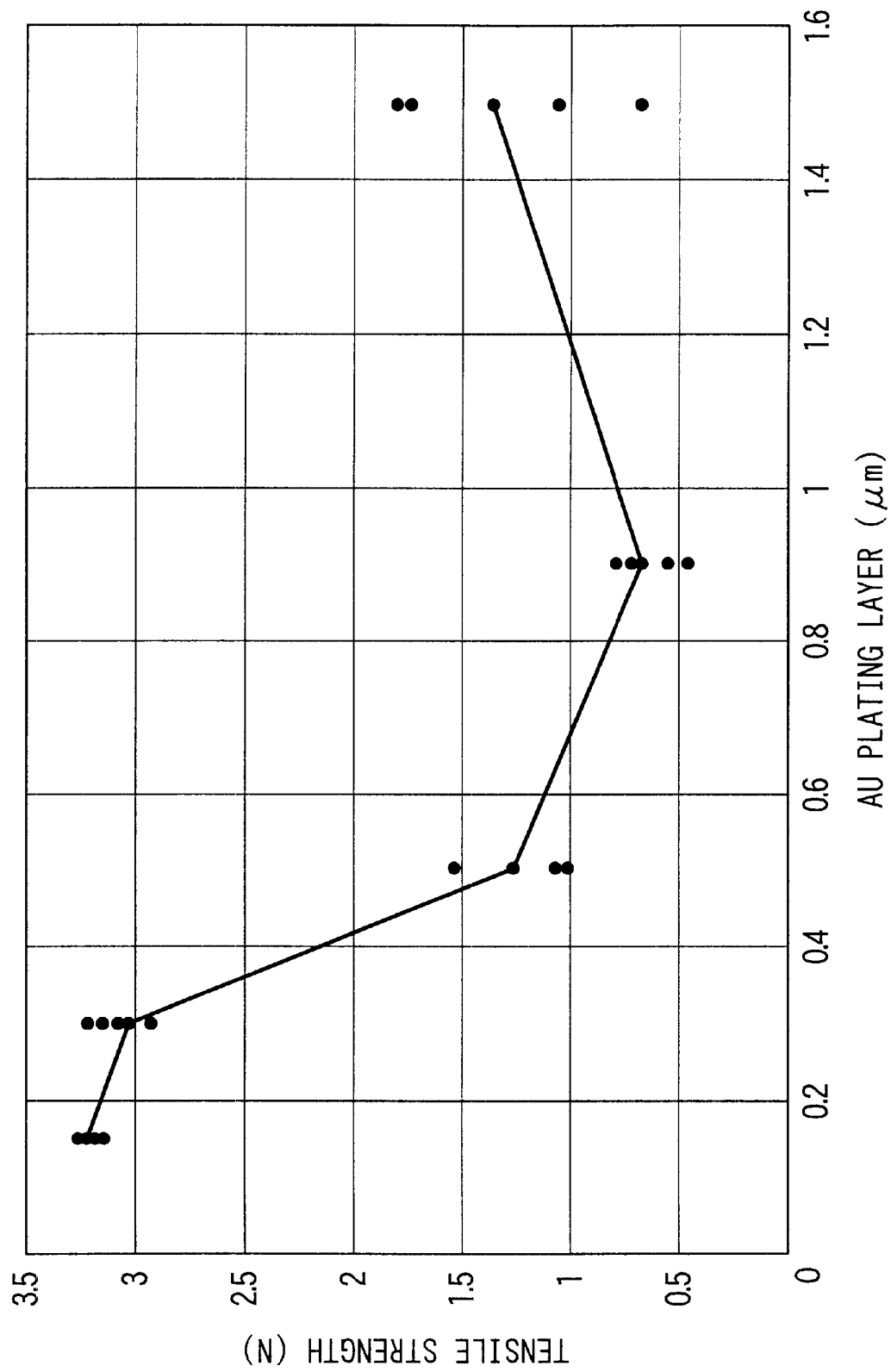
FIG. 5 is a line graph showing a relationship between a thickness of an Au plating layer and a tensile strength between metal wiring and the pad according to the first embodiment.

Experimental results shown in FIG. 5 illustrate the benefits of the above configuration. Specifically, the Al wiring 61 having $\phi$250 $\mu$m was bonded to the first side pads 23. The electrical device S1 was then heated to 125° C. for 1000 hours. Thereafter, a relationship between the thickness of the Au plating layers 23c (unit:$\mu$m) and a tensile strength between the Al wiring 61 and the first side pads 23 (unit:N) was determined.

As shown in FIG. 5, the tensile strength greatly decreased when the thickness of the Au plating layers 23c was more than 0.5 $\mu$m due possibly to the Kirkendall void. Accordingly, the electrical and physical connection between the first side pads 23 and the Al wiring 61 was enriched when the thickness of the Au plating layers 23c was less than 0.5 $\mu$m.

This embodiment is able to prevent the first side pads 23 bonded with Al wiring 61 from oxidizing. As a result, the electrical and physical connection between the first side pads 23 and the Al wiring 61 is enriched.

On the other hand, when the thickness of the Au plating layers 21c of the first side pads 21 is 0.05 $\mu$m or more, joint strength between the first side pads 21 and the Au wiring 60 can be ensured up to a practicable level such as, for example, a 10$g$ joint strength with respect to the Au wiring 60 having $\phi$30 $\mu$m.

More specifically, when the joint strength is, for example, 3 g when the thickness of the Au plating layer 21c is 0.02 $\mu$m and therefore not enough to satisfy the practicable level, the joint between the first side pad 21 and the Au wiring 60 may peel during use. Further, as has been experimentally shown, the joint strength satisfies the practicable level if the thickness of the Au plating layer 21c is over 0.05 μm. However, it is preferable that the thickness of the Au plating layer 21c is within a range from 0.05 μm to 0.5 μm, and more preferably between about 0.1 μm to 0.3 μm.

Further, in this embodiment, a ceramic substrate is used as the substrate 10 and the wiring layer is made of a W, Mo or W-Mo alloy. Generally, it is possible that bondability between wiring and pad decreases when the Cu-Au construction is used as the pad. However, this embodiment is able to obviate above-mentioned disadvantage, because the first side pads 21, 23 are formed on the solid ceramic substrate or the solid wiring layer.

Next, a method for adjusting the thickness of the first side pads 21, 23 is described.

As mentioned above, the bondability between the first pads 21 and the Au wiring 60 increases in proportion to the thickness of the Au planting layers 21c. However, it is preferable that the Au planting pads 23c for bonding with Al wiring 61 is comparatively thin in order to suppress a generation of the Kirkendall void. That is, these are conflicting requirements.

Accordingly, in this embodiment, the thickness of the Au plating layers 23c is adjusted using plasma etching, which is generally used as plasma cleaning to physically eliminate pollutants in an Au plating.

Specifically, the first side pads 23 are etched by plasma etching while masking the first side pads 21 in order not to etch by the plasma etching. In this way, the surfaces of the first planting layers 23 are physically eliminated.

Figure 6:
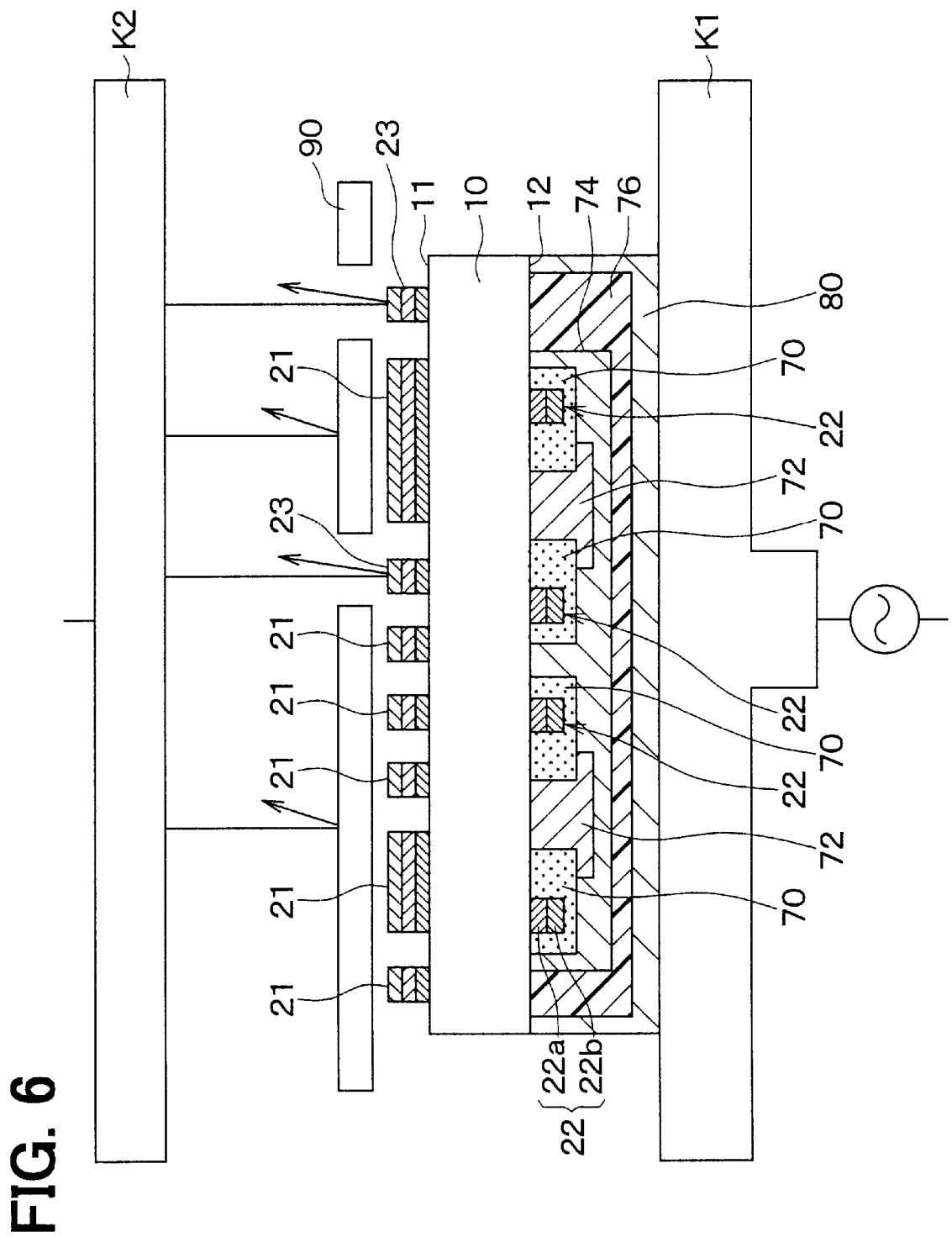
FIG. 6 is a schematic view showing thickness adjustment process of the Au plating layer by plasma cleaning according to the first embodiment.

For example, the thickness adjustment process of the first plating pads 21, 23 using plasma etching is practiced in the apparatus shown in FIG. 6. Incidentally, the thickness adjustment process shown in FIG. 6 is practiced after the process shown in FIG. 4B.

As shown in FIG. 6, first, the substrate 10 having the first side pads 21, 23 is prepared. The respective first side pads 21, 23 have the Au plating layers 21c, 23c of a predetermined thickness of, for example, 0.35 μm. Next, the substrate 10 is disposed between both electrodes K1, K2 that are accommodated in a vacuum chamber of the plasma etching apparatus so that the first surface 11, on which the first side pads 21, 23 are formed, turns to an upper side.

Further, the substrate 10 is covered by a mask 90 that has openings corresponding to the first side pads 23 so as not to irradiate the plasma to the first side pads 21 for bonding with the Au wiring 60 and for mounting the first and second IC tips 30, 55. That is, the mask 90 covers the substrate 10 to irradiate the plasma only the first pads 23 for bonding with the Al wiring 61.

Subsequently, plasma etching is carried out. For example, the pressure in the vacuum chamber is decreased to $10^{-6}$ Torr. Thereafter the pressure in the vacuum chamber is increased to $10^{-3}$ Torr by introducing Ar gas. Next, high voltage or voltage with high frequency is applied between both electrodes K1, K2. Therefore, the Ar ion is irradiated to the surface of the Au plating layers 23c of the first side pads 23 so that the surface of the Au plating layers 23 is etched.

Accordingly, the surface of the Au plating layers 23c is shaved off and the thickness thereof is decreased. As a result, the thickness of the Au plating layers 23c is thinner than the Au plating layers 21c of the first side pads 21. For example, the thickness of the Au plating layers 23c that has 0.35 μm thickness changes to 0.3 μm after 10 min of irradiation with the plasma.

Figure 7:
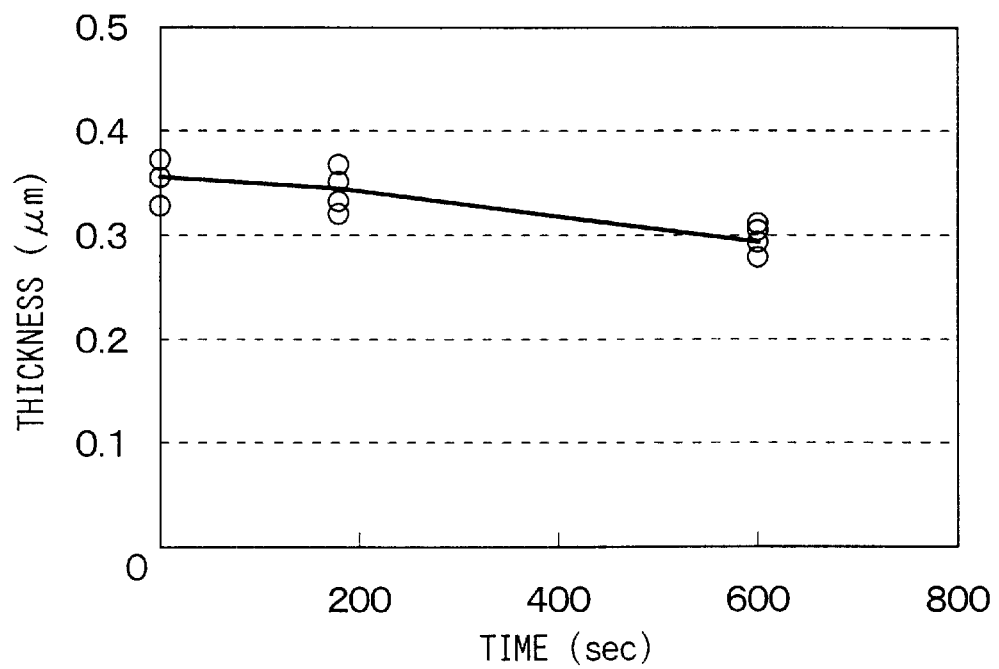
FIG. 7 is a line graph showing a relationship between plasma irradiating time and the thickness of the Au plating layer.

The relationship of the plasma irradiation time and the thickness of the Au plating layer is shown like FIG. 7. In an experiment shown in FIG. 7, a fast chamber model No.SFT-3200S made by Seiko Instruments Inc. is used. The tube voltage is set on 45 kV and the tube current is set 200 μA in the experiment.

In this way, by using plasma cleaning, the thickness of the Au plating layers 23c can be thinner than that of the Au plating layers 21c. Accordingly, both thicknesses can be set independently, so that the former can be set to less than 0.5 μm and the latter can be set to 0.05 μm or more.

(Second Embodiment)

Figure 8:
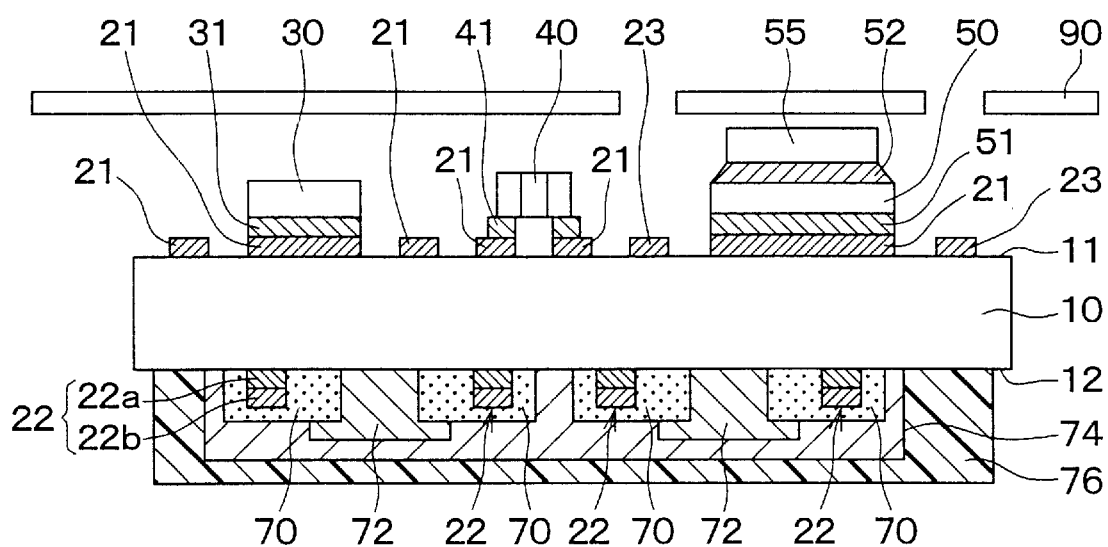
FIG. 8 is a schematic view showing thickness adjustment process of the Au plating layer by plasma cleaning according to a second embodiment.

A production process view of an electrical devise shown in FIG. 8 represents a modification of the first embodiment. As shown in FIG. 8, plasma cleaning is carried out after IC tips 30, 55, a capacitor 40 and the like are bonded on the substrate 10.

In this case, it is possible to eliminate an oxide or impurities before Au wiring 60 and Al wiring 61 are bonded. The oxide is formed on first side pads 21, 23 when the heat for fixing electrical parts 30, 40, 50 and 55 is supplied. Also, the impurities scatter and are formed on the first side pads 21, 23 when an adhesive 31 is hardened.

According to the second embodiment, it is possible to enrich the bondability of the Al wiring 61 and the first side pads 23.

(Third Embodiment)

Figure 9:
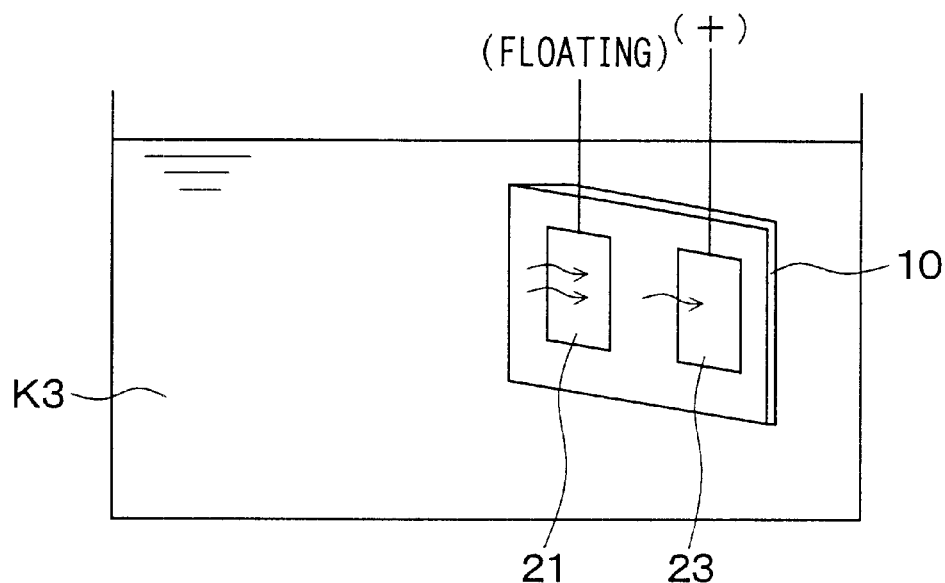
FIG. 9 is a schematic view showing thickness adjustment method of the Au planting layer according to a third embodiment.

A production process view of an electrical device shown in FIG. 9 represents a modification of the first embodiment. As shown in FIG. 9, the thickness of Au plating layers 21c, 23c can be distinguished when the Au plating layers 21c, 23c are deposited.

Specifically, first, the substrate 10 is immersed into a K3 plating solution, e.g., a gold cyanide solution. Next, land portions on a substrate 10 where Au plating layers 23c should be deposited are applied to a plus voltage, while land portions on the substrate 10 where Au plating layers 21c should be deposited are floated.

In this way, an Au deposition speed of the Au plating layers 23c is less than that of the Au plating layers 21c. Accordingly, the Au plating layers 23c can be formed thinner than the Au plating layers 21c. Further, the former can be set less than 0.5 μm and the latter can be set to 0.05 μm or more, if conditions such as the deposition rate, the application voltage and the like are preliminarily adjusted.

(Fourth Embodiment)

Figure 10:
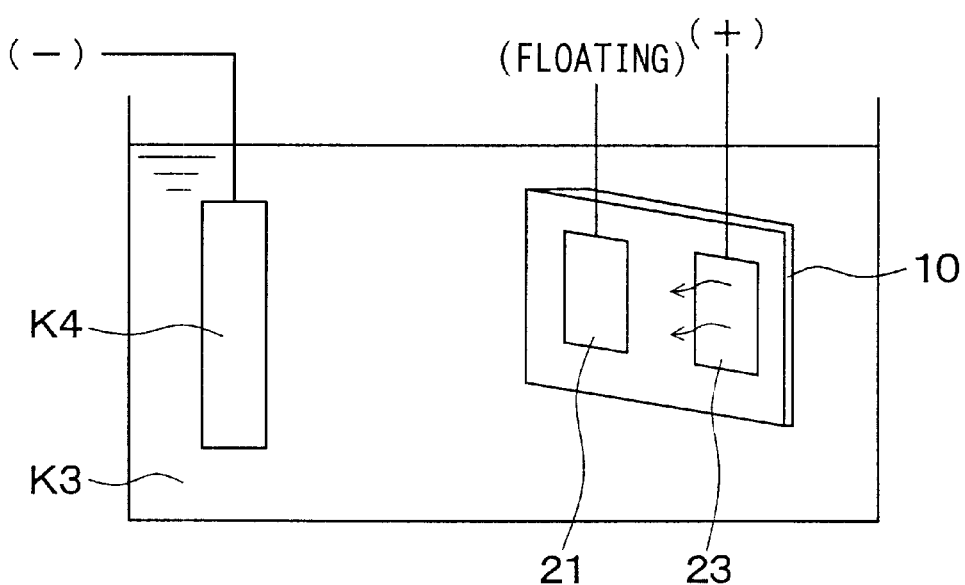
FIG. 10 is a schematic view showing thickness adjustment method of the Au planting layer according to a fourth embodiment.
Figure 11A:
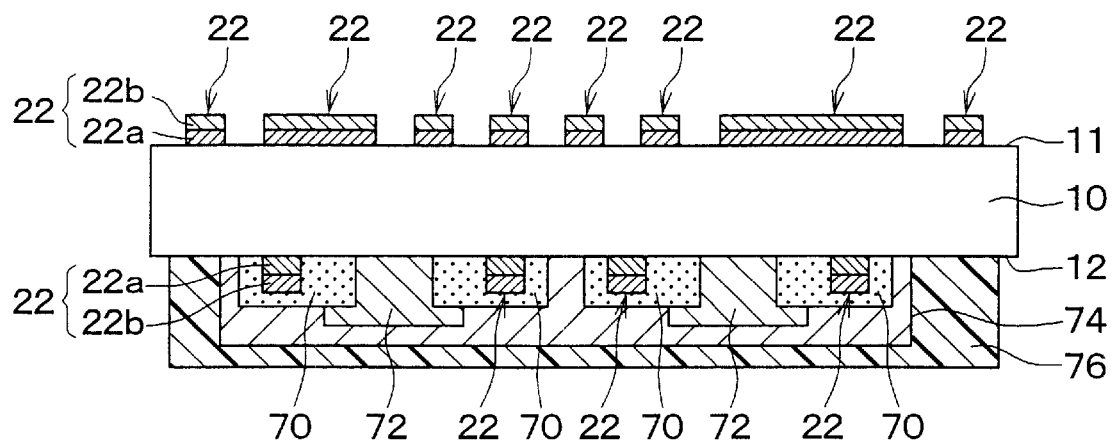
FIGS. 11A, 11B are cross sectional views showing production process of an electrical device according to prior work.
Figure 11B:
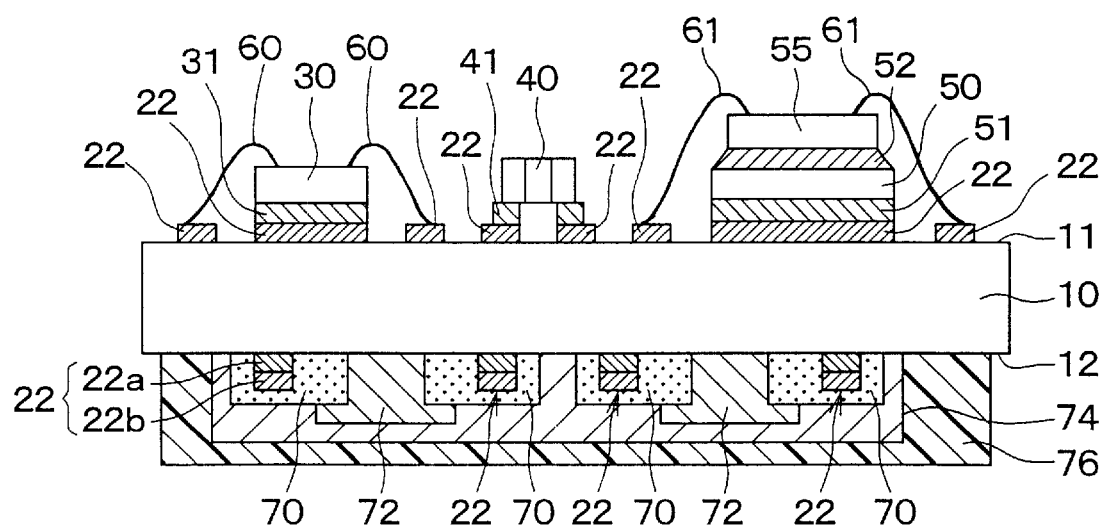

A production process view of an electrical device shown in FIG. 10 represents a modification of the third embodiment. As shown in FIG. 10, the thickness of Au plating layers 21c, 23c can also be distinguished when the Au plating layers 21c, 23c are deposited.

Specifically, first, Au plating layers 21c, 23c whose thicknesses are 0.5 μm or more are preliminarily deposited previously. Next, the substrate 10 is immersed into a K3 plating solution. Subsequently, a plus voltage is applied to first side pads 23 and first side pads 21 are floated, and a Pt electrode K4 is used as a minus electrode.

In this way, a solution rate of the Au plating layers 23c is higher than that of the Au plating layers 21c. Accordingly, the Au plating layers 23c can be formed thinner than the Au plating layers 21c. Further, the former can be set to less than 0.5 μm and the latter can be set to 0.05 μm or more if the solution rate is preliminarily adjusted.

(Modifications)

A parcel plating method can be adapted to deposit the Au plating layers 21c, 23c in spite of above-mentioned methods. Namely, for example, the Au plating layers 21c, 23c whose respective thicknesses are less than 0.5 μm are deposited with respect to the first side pads 21, 23. Next, at least the Au plating layers 23c are covered by a mask. Thereafter, the Au plating layers 21c are completely deposited.

Further, a sand blast method can be adapted to treat the surface of the Au plating layers 23c in spite of above-mentioned methods. Namely, the Au plating layers 21c, 23c whose respective thicknesses are 0.5 µm or more are deposited with respect to the first side pads 21, 23. Next, the Au plating layers 23c are shaved off by the sand blast method.

Moreover, this invention can be adapted for an electrical device whose whole pads are bonded with Al wiring. In this case, all pads are constructed as the first side pads 23.

This invention is also adaptable for an electrical device whose second side pads 22 are used for bonding with the Au and Al wiring or for connecting the electrical parts (e.g., above-mentioned parts 30, 40 and 50) on the second side 12. In this case, the second side pads 22 are formed as a three-layer construction. Further, each Au planting layer included in the second side pads 22 that is bonded with Au wiring has a thickness of 0.05 µm or more. Each Au planting layer included in the second side pads 22 that is bonded with Al wiring is formed with a thickness of less than 0.5 µm.

While the above description is of the preferred embodiments of the present invention, it should be appreciated that the invention may be modified, altered, or varied without deviating from the scope and fair meaning of the following claims.

What is claimed is:

1. An electrical device comprising:

a substrate having a first surface and a second surface;

a plurality of pads formed on at least one of the first and second surfaces, wherein each of the plurality of pads has a Cu plating layer and an Au plating layer that is directly formed on the Cu plating layer; and Al wiring bonded with at least one of the plurality of pads, wherein a thickness of an Au plating layer of the at least one of the plurality of pads that is bonded with the Al wiring is less than 0.5 µm.

2. An electrical device according to claim 1, wherein the thickness of the Au plating layer that is bonded with the Al wiring is between 0.05 µm to 0.5 µm.

3. An electrical device according to claim 1 further comprising:

Au wiring bonded with at least one of the pads, wherein a thickness of the Au plating layer that is bonded with the Au wiring is 0.05 µm or more.

4. An electrical device according to claim 1 further comprising:

wiring bonded with the pads, wherein the thickness of the Au plating layer that is bonded with the wiring is between 0.05 µm to 0.5 µm.

5. An electrical device according to claim 1 further comprising:

at least one wiring layer formed on the substrate;

wherein the substrate is made of a ceramic material, and the wiring layer is made of one of W (tungsten), Mo (molybdenum) and a W-Mo alloy, and wherein the wiring layer is electrically connected to at least one of the plurality of pads.

6. An electrical device comprising:

a substrate having a first surface and a second surface;

a plurality of pads formed on at least one of the first and second surfaces;

Al wiring bonded with at least one of the pads; and

Au wiring bonded with at least one of the pads;

wherein each of the plurality of pads bonded with the Al wiring and the Au wiring has a Cu plating layer and an Au plating layer that is directly formed on the Cu plating layer, wherein the thickness of an Au plating layer that is bonded with the Al wiring is less than 0.5 µm, and wherein a thickness of an Au plating layer that is bonded with the Au wiring is 0.05 µm or more, and wherein the thickness of the Au plating layer that is bonded with the Au wiring is thicker than that of the Au plating layer that is bonded with the Al wiring.

7. An electrical device according to claim 6, wherein the thickness of the Au plating layer that is bonded with the Al wiring is between 0.05 µm to 0.5 µm.

8. An electrical device according to claim 6 further comprising:

at least one wiring layer formed on the substrate;

wherein the substrate is made of a ceramic material, and the wiring layer is made of one of W (tungsten), Mo (molybdenum) and a W-Mo alloy, and wherein the wiring layer is electrically connected to at least one of the plurality of pads.

* * * * *